United States Patent [19]
Taniguchi

[11] Patent Number: 6,145,683
[45] Date of Patent: *Nov. 14, 2000

[54] SET-UP ASSEMBLY OF CASING FOR ELECTRIC APPLIANCES

[75] Inventor: Eiichi Taniguchi, Kawasaki, Japan

[73] Assignee: Nitsuko Corporation, Kanagwa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/183,511

[22] Filed: Oct. 30, 1998

[30] Foreign Application Priority Data

Feb. 17, 1998 [JP] Japan .................................. 10-049992

[51] Int. Cl.[7] .................................. B65D 6/00; B65D 6/24
[52] U.S. Cl. ........................ 220/4.02; 220/4.03; 220/4.26; 220/621; 220/622; 220/692
[58] Field of Search ...................................... 220/4.02, 3.3, 220/3.7, 3.8, 3.94, 4.03, 4.33, 480, 481, 617, 621, 622, 692, 693, DIG. 25, 4.26, 618; 174/48, 65 R, 66

[56] References Cited

U.S. PATENT DOCUMENTS

| | | | |
|---|---|---|---|
| 1,016,925 | 2/1912 | Appleton | 220/3.94 |
| 1,167,879 | 1/1916 | Bayliss et al. | 220/3.94 |
| 1,249,313 | 12/1917 | Boyton et al. | 220/3.94 |
| 1,672,263 | 6/1928 | Kruse | 220/3.94 |
| 2,987,690 | 6/1961 | Marbais | 220/3.94 X |
| 5,402,322 | 3/1995 | Kunkler et al. | 220/4.02 |
| 5,703,327 | 12/1997 | Jorgensen | 220/3.94 X |
| 5,751,545 | 5/1998 | Jung | 361/683 |
| 5,853,098 | 12/1998 | Elder . | |

FOREIGN PATENT DOCUMENTS 9-215016  8/1997  Japan .

*Primary Examiner*—Allan N. Shoap
*Assistant Examiner*—Niki M. Eloshway
*Attorney, Agent, or Firm*—Lynn & Lynn

[57] ABSTRACT

A set-up assembly of casing for electric appliances includes four members of a base, left and right side covers and a front cover, in which the base and side covers are coupled with an interlocking coupling and internal screw fastening, the front cover is mounted to the base with latches and clamps, and pairs of the base and front cover mounted to the base are provided for direct connection in mutually side-by-side manner, while the bases in the adjacent pairs can be mutually coupled with the interlocking couplings and connected in gripping manner with connecting metal fittings, for the extension in integralized state, without exposing wiring cables of the appliances to the exterior of the casing.

2 Claims, 4 Drawing Sheets

SET-UP ASSEMBLY OF CASING FOR ELECTRIC APPLIANCES

BACKGROUND OF THE INVENTION

This invention relates to a casing of electric appliances and, more particularly, to a set-up assembly of the casing for such electric appliances as main telephone exchange devices, data repeaters, memories and the like which require increase in the capacity in response to a demand.

DESCRIPTION OF RELATED ART

An example of extendible casing for the electric appliances has been disclosed in Japanese Patent Laid-Open Publication No. 9-215016, in which a plurality of casings for the electric appliances respectively in independent state are enabled to be mutually coupled as disposed adjacent to each other, and the casings are provided with a communicating part opened in mutually opposing walls of adjacent ones of the casings for electrical connection between connectors in the adjacent casings with cables having the connectors and passed through such communicating part.

However, such known casing as described above has been troublesome since, in extending the casings, the appliances in the respective independent casings have to be connected with cables passed through partitions so that, not only required wiring work for the extension has been complicated, but also damage of the cables and trouble of electromagnetic disturbance noise are apt to easily occur. In addition, the known casing has such inconvenience that manufacturing costs are high, occupying volume is bulky, appearances are deteriorated, and so on.

SUMMARY OF THE INVENTION

An object of the present invention is to provide a set-up assembly of casing for electric appliances which can be easily set up while keeping the appearances excellent, and also easily extended in integral state, without requiring connecting work with cables between the appliances in the casing.

According to the present invention, the above objects can be realized by means of a set-up assembly of casing for electric appliances, comprising at least a base, right and left side covers and a front cover, the base and side covers being provided for mutual coupling with an interlocking coupling means including interlocking grooves and hooks made at side edges of a back wall of the base and at back side edge of the side covers, the side covers being provided for being fixed to the base as fastened by screws with respect to mounting lugs projecting inward from the side covers and kept in engagement with mounting seats of the base, and the base and front cover being provided, for mounting the front cover to the base, with latch means and clamp means substantially at upper and lower ends.

Other objects and advantages of the present invention shall be made clear in the following description of the invention detailed with reference to preferred embodiments shown in accompanying drawings.

Figure 1:
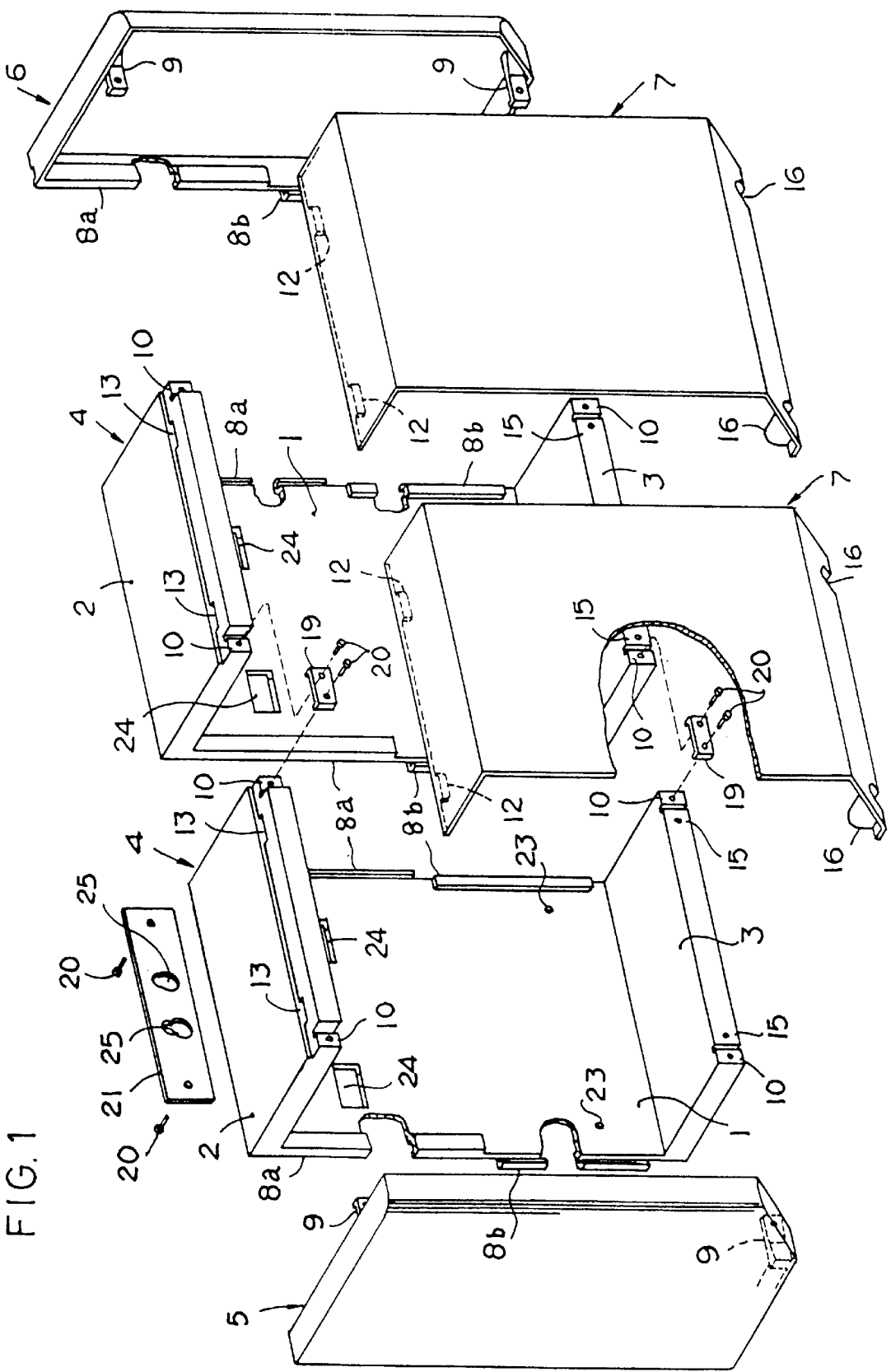
FIG. 1 is a perspective view as disassembled of the set-up assembly of the casing in duplex structure for electric appliances in an embodiment according to the present invention.

While the present invention shall now be described with reference to the embodiments shown in the drawings, it should be appreciated that the intention is not to limit the invention only to these embodiments shown but rather to include all alterations, modifications and equivalent arrangements possible within the scope of appended claims.

DETAILED DESCRIPTIN OF THE PREFERRED EMBODIMENTS

Figure 2:
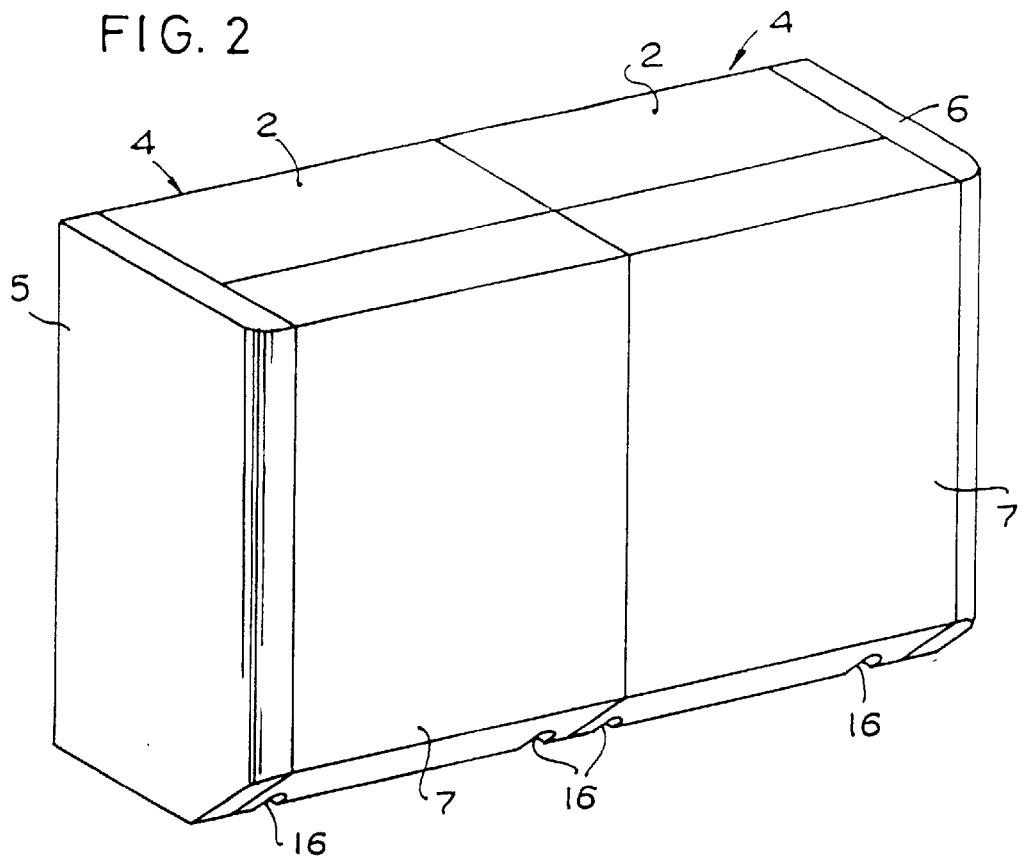
FIG. 2 is a perspective view as assembled of the set-up assembly of FIG. 1.
Figure 3:
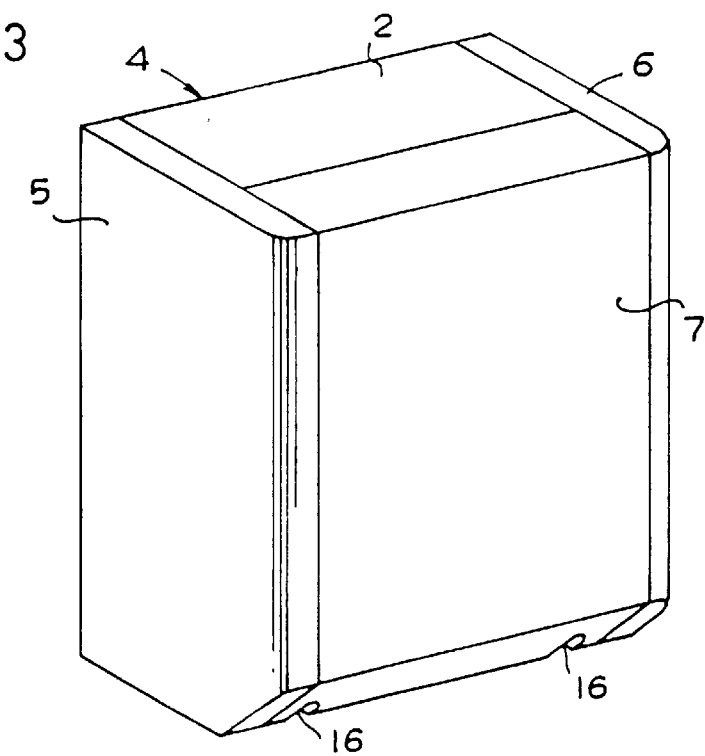
FIG. 3 is a perspective view of the set-up assembly of the casing for electric appliances in single unit structure in another embodiment according to the present invention.
Figure 4:
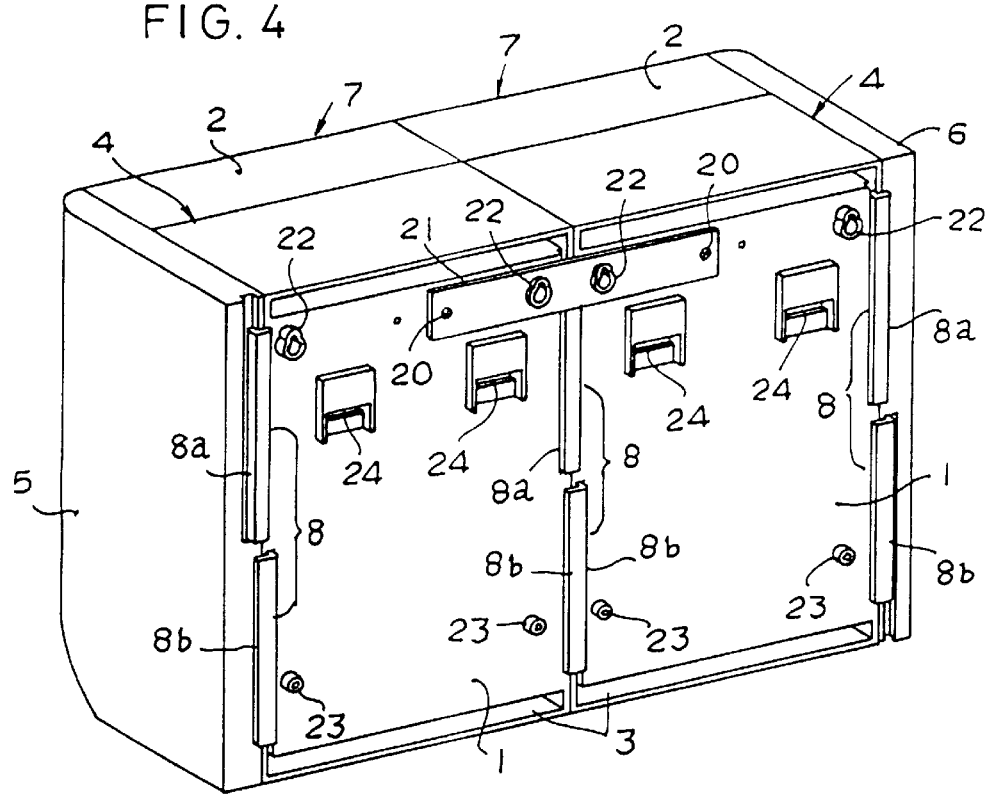
FIG. 4 is a perspective view as assembled of the set-up assembly of FIG. 1 as viewed from its rear side.
Figure 5:
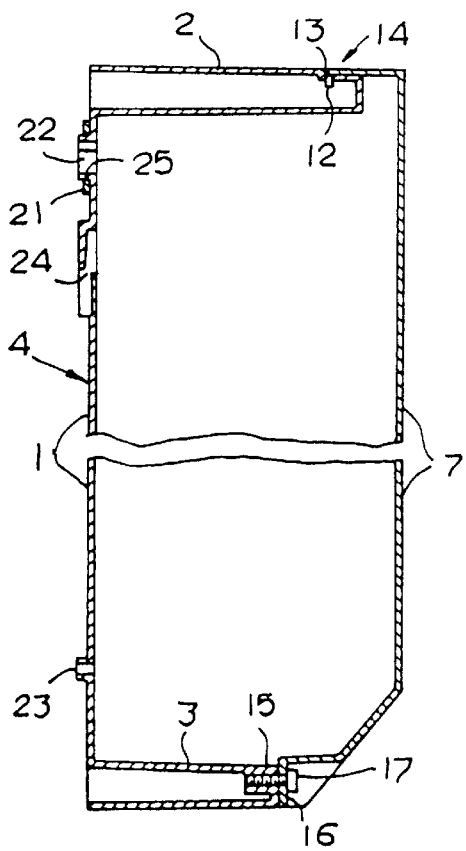
FIG. 5 is a vertically sectioned view as assembled of the set-up assembly of FIG. 1.
Figure 6:
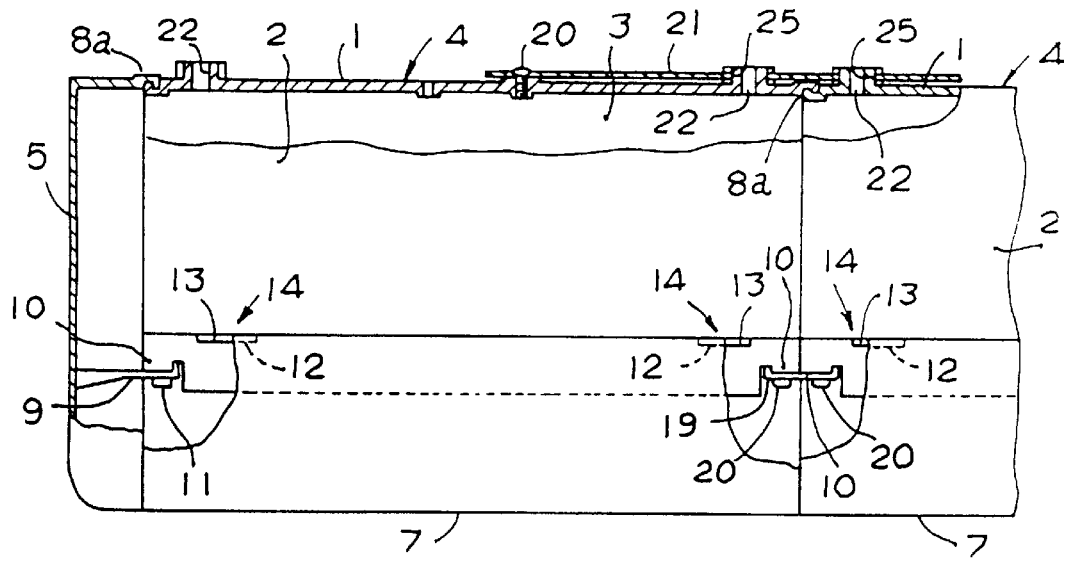
FIG. 6 is a fragmentary plan view of the set-up assembly of FIG. 1 with parts thereof shown as removed.
Figure 7:
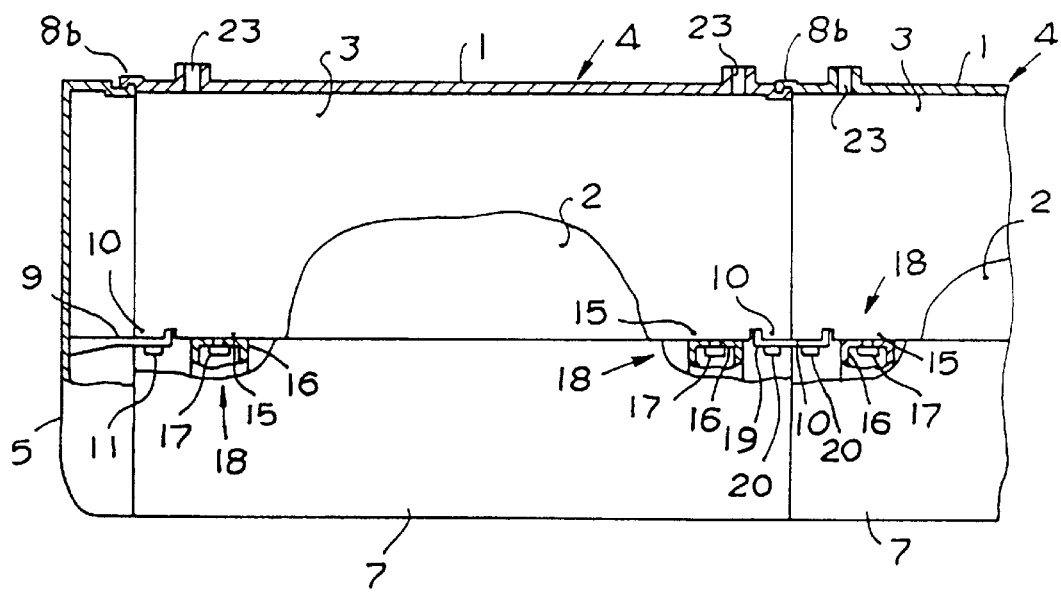
FIG. 7 is a fragmentary plan view of the set-up assembly of FIG. 1 with some other parts than those of FIG. 6 shown as removed.

The casing for electric appliances according to the present invention comprises, as shown for example in FIGS. 1 and 2, a base 4 having a back wall 1, a top wall 2 and a bottom wall 3; a left side cover 5; a right side cover 6; and a front cover 7. In this case, as shown in FIG. 1 and FIGS. 4–7, the base 4 is formed to have a substantially U-shape in section, while the front cover 7 is formed to have a substantially reverse U-shape in section. Further, the left and right side covers 5 and 6 are formed in a tray shape, while side edges of the back wall 1 of the base 4 and corresponding back side edges of the side covers 5 and 6 are provided with upper half couplings 8a and lower half couplings 8b which are interlocking each other in forward and backward directions of the casing but are mutually slidable in vertical directions, the interlocking of which couplings 8a and 8b being made alternately forward and backward. With these interlocking couplings 8a and 8b, an interlocking coupling means 8 is constituted. The left and right side covers 5 and 6 are respectively provided substantially at top and bottom ends with mounting lugs 9 projecting inward, while the base 4 is provided at positions corresponding to the lugs 9 with mounting seats 10, so that, as the covers 5 and 6 are mounted to the base 4, the mounting lugs 9 are seated on the mounting seats 10 and screws 11 are driven through the lugs to the seats to fasten the side covers to the base, as seen in FIGS. 6 and 7.

In mounting the front cover 7 to the base 4, the front cover 7 is provided at the top end edge with hooks 12 downward projected, while the base 4 is provided at corresponding positions adjacent to the top end with receiving holes 13 adapted to receive the hooks 12, so that a latch means is constituted by these hooks 12 and receiving holes 13. Further, the base 4 is provided at positions close to the bottom end with mounting seats 15 while the front cover 7 is provided at corresponding positions close to the bottom end with screw seats 16 so that a clamping means 18 is constituted by the mounting seats 15 and screw seats 16 as well as screws 17. Thus, after latching the hooks 12 of the front cover 7 to the receiving holes 13 of the base 4, the screws 17 are driven through the seats 16 to the mounting seats 15 to fasten the cover 7 to the base 4.

The above top and bottom relationship between the latch means 14 and the clamp means 18 may be reversed. That is, the latch means 14 may be provided to the bottom end while the clamp means 18 may be provided to the top end.

In extending the casing, two or more of the bases 4 are mutually joined directly at edges with the interlocking coupling means 8 and are coupled by means of the screws with connecting metal fittings as shown in FIGS. 1, 4, 6 and 7. For practical coupling arrangement by means of the coupling metal fittings, the adjacent bases 4 are mutually connected in a so-called gripping manner, by means of U-shaped connecting metal fittings 19 which are fastened against the mounting seats 10 by screws 20, or by means of a flat plate shaped connecting metal fitting 21 fastened by the screws 20 across the back walls 1 of the adjacent bases 4. It is possible to employ both connecting means using the U-shaped connecting metal fittings 19 and the flat plate metal fitting 21.

In mounting the front covers 7 to the thus coupled bases 4 upon extending the casing, the covers 7 are mounted as has been described, such that the hooks 12 of the covers 7 are latched in the receiving holes 13 of the bases 4, and then the screws 17 are driven through the screw seats 16 of the covers 7 into the mounting seats 15 of the bases 4 to fasten the covers to the bases.

Further it is preferable that the base 4 is provided on its rear surface with release-and-lock holes 22 for hanging the casing against a wall, and screw-passing holes 23 for fastening the casing to the wall, together with or without receptacles 24 adapted to receive hooks (not shown) of wall-hanging metal fittings. Optimumly, the foregoing connecting metal fitting 21 is provided with engaging holes 25 for fitting to boss parts of the release-and-lock holes 22 of the base 4, for restrictive positioning between the bases 4 and the fitting 21.

In the interior of the casing for appliances thus increased in the volume by the extension, it is possible to mount a large size mother board across the adjacent ones of the bases 4, so that the connection cables between the respective elements of the extended casing 1 can be omitted, and any troubles occurring due to the exposure of the cables to the exterior can be avoided.

What is claimed is:

1. A set-up assembly of a casing for electric appliances, the casing comprising:
   a base having a back wall and top and bottom walls continuing to top and bottom ends of the back wall to be substantially U-shaped in cross section with left and right side and front side opened;
   a front cover having a front wall and top and bottom walls continuing to top and bottom ends of the front wall to be substantially U-shaped in cross section with left and right sides and back side opened;
   left and right side covers respectively fitted to close each of the opened left and right sides of a unit of the base and front cover combined in edge-to-edge relationship at their top and bottom walls;
   the base being provided with first interlocking coupling means having mutually interlocking coupled grooves and hooks on both side edges, receiving holes made in one of the top and bottom walls and adjacent to the front end thereof to extend inward from the outer surface of the wall, and mounting seats at both side end parts of the front ends of the top and bottom walls and at positions to be covered by the top and bottom walls of the front cover;
   the left and right side covers being respectively provided with mounting lugs projecting inward on their inner surfaces at positions corresponding to the mounting seats of the base adjacent to their top and bottom ends, and second interlocking coupling means interlocked to the first interlocking coupling means of the base at an end edge on the back wall;
   the front cover being provided with inward projected latches engageable in the receiving holes of the base at one of the top and bottom walls which corresponds to the one of the top and bottom walls of the base which has the receiving holes, and clamp holes adjacent to an end part of the other one of the top and bottom walls; and
   the set-up assembly being attained by interlocking the second interlocking coupling means at the end edges on the back wall side of both side covers with the first interlocking coupling means at the side edges of the base, fastening with screws the mounting lugs of the side covers against the mounting seats of the base to mount both side covers to both opened sides of the base, and mounting the front cover to the base by engaging the latches into the receiving holes of the base and fastening screws through the clamp holes of the front cover to the corresponding mounting seats of the base.

2. The set-up assembly according to claim 1 wherein a plurality of sets of the bases and front covers are employed, in which sets adjacent ones of the bases are mutually coupled at adjacent side edges with the first interlocking coupling means of the bases and the front covers are respectively mounted to each of the bases, and the casing further comprises a connecting metal fitting fastened by screws onto back surfaces of the back walls of the adjacent bases for gripping them to each other.

* * * * *